(12) United States Patent
Zhou et al.

(10) Patent No.: US 11,098,886 B2
(45) Date of Patent: Aug. 24, 2021

(54) LIGHT SOURCE SYSTEM AND LIGHTING DEVICE

(71) Applicant: YLX INCORPORATED, Shenzhen (CN)

(72) Inventors: Meng Zhou, Shenzhen (CN); Yi Li, Shenzhen (CN)

(73) Assignee: YLX Incorporated, Shenzhen (CN)

( * ) Notice: Subject to any disclaimer, the term of this patent is extended or adjusted under 35 U.S.C. 154(b) by 0 days.

(21) Appl. No.: 16/958,342

(22) PCT Filed: May 25, 2018

(86) PCT No.: PCT/CN2018/088524
§ 371 (c)(1),
(2) Date: Jun. 26, 2020

(87) PCT Pub. No.: WO2019/128079
PCT Pub. Date: Jul. 4, 2019

(65) Prior Publication Data
US 2020/0400299 A1    Dec. 24, 2020

(30) Foreign Application Priority Data

Dec. 28, 2017 (CN) .......................... 201711466234.5

(51) Int. Cl.
*F21V 9/30* (2018.01)
*F21V 29/10* (2015.01)
(Continued)

(52) U.S. Cl.
CPC ............... *F21V 29/10* (2015.01); *F21V 7/05* (2013.01); *F21V 9/30* (2018.02); *G02B 27/126* (2013.01); *G02B 27/283* (2013.01)

(58) Field of Classification Search
CPC ... F21V 29/10; F21V 7/05; F21V 9/30; G02B 27/126; G02B 27/283
See application file for complete search history.

(56) References Cited

U.S. PATENT DOCUMENTS

2012/0196011 A1* 8/2012 Felix .......................... A23L 3/00
426/243
2013/0314937 A1* 11/2013 Takahashi ............... F21S 41/16
362/538

(Continued)

FOREIGN PATENT DOCUMENTS

| CN | 1762061 | 4/2006 |
|----|---------|--------|
| CN | 104033753 | 9/2014 |

OTHER PUBLICATIONS

International Search Report for International Application PCT/CN2018/088524, dated Sep. 25, 2018.

*Primary Examiner* — Donald L Raleigh
(74) *Attorney, Agent, or Firm* — Burris Law, PLLC (57) ABSTRACT

The present disclosure provides a light source system and a lighting device including the same. The light source system includes at least one laser configured to emit excitation light, a substrate, a reflective layer, a wavelength conversion layer, and a light guiding element. The substrate is made of material with a high thermal conductivity and provided with a notch. The laser is received in a sidewall of the notch. The reflective layer covers walls of the notch and is configured to reflect the excitation light. The wavelength conversion layer is provided on a part of the reflective layer and configured to perform wavelength conversion on the excitation light to obtain excited light. The light guiding element covers an opening of the notch and configured to guide the excitation light and the excited light, to obtain light to be emitted by the light source system.

21 Claims, 4 Drawing Sheets

(51) Int. Cl.
*F21V 7/05* (2006.01)
*G02B 27/12* (2006.01)
*G02B 27/28* (2006.01)

(56) References Cited

U.S. PATENT DOCUMENTS

2015/0357790 A1 12/2015 Jeoung et al.
2019/0097722 A1* 3/2019 McLaurin ............ H04B 10/116

* cited by examiner

LIGHT SOURCE SYSTEM AND LIGHTING DEVICE

CROSS-REFERENCE TO RELATED APPLICATIONS

This application is a U.S. national phase application of International Application No. PCT/CN2018/088524, filed on May 25, 2018, which claims priority to and the benefit of Chinese Patent Application No. 201711466234.5, filed on Dec. 28, 2017. The disclosures of the above applications are incorporated herein by reference.

FIELD

The present disclosure relates to the technical field of light sources, and in particular, to a light source system and a lighting device.

BACKGROUND

This section is intended to provide a background or context for specific forms or variations of the present disclosure recited in the claims. The description here is not admitted to be prior art just because it is included in this section.

At present, a solid-state light source used in the lighting field uses a blue laser and phosphors to output white light. The blue laser can operate at high drive power densities and produce relatively high luminous flux. A light source using the blue laser can have brightness which is dozens of times higher than that of an LED. For applications with strict restrictions in volume and etendue, the blue laser has inherent advantages as light sources.

At present, the solid-state light sources with the blue laser have aspects such as heat dissipation of a blue laser chip and a wavelength conversion layer.

SUMMARY

According to one form of the present disclosure, a light source system includes:
at least one laser configured to emit excitation light;
a substrate made of material with a high thermal conductivity and provided with a notch, where the at least one laser is received in at least one sidewall of the notch;
a reflective layer covering a wall of the notch and configured to reflect the excitation light;
a wavelength conversion layer provided on a part of the reflective layer and configured to perform wavelength conversion on the excitation light to obtain excited light; and
a light guiding element covering an opening of the notch and configured to guide the excitation light and the excited light, to obtain light to be emitted by the light source system.

In some variations of the present disclosure, a lighting device includes the above light source system.

In the light source system and the lighting device including the light source system provided by the teachings of the present disclosure, the substrate in the light source system is made of material with a high thermal conductivity, the laser is received in the substrate, and heat of the wavelength conversion layer is transferred to the substrate through the reflective layer, thereby enhancing the heat dissipation of the laser and the wavelength conversion layer in the light source system. In addition, since the laser and the wavelength conversion layer are located in the same notch, the light source system and the lighting device each have a small volume and each have a simple and compact structure.

DRAWINGS

In order that the disclosure may be well understood, there will now be described various forms thereof, given by way of example, reference being made to the accompanying drawings, in which.

SYMBOL DESCRIPTION OF MAIN COMPONENTS

| | |
|---|---|
| Light source system | 100, 200, 300 |
| Substrate | 110, 210 |
| Notch | 111, 211 |
| Sidewall | 111a, 211a |
| Bottom wall | 111b, 211b |
| Light guiding element | 120, 320 |
| Laser | 130, 230, 330 |
| Beam deflecting device | 140 |
| Wavelength conversion layer | 150, 250, 350 |
| Reflective layer | 160, 360 |

The following specific forms will further illustrate the present disclosure with reference to the above drawings.

The drawings described herein are for illustration purposes only and are not intended to limit the scope of the present disclosure in any way.

DETAILED DESCRIPTION

The present disclosure provides a light source system and a lighting device which can solve the heat dissipation problems of an internal laser and a wavelength conversion layer.

Figure 1:
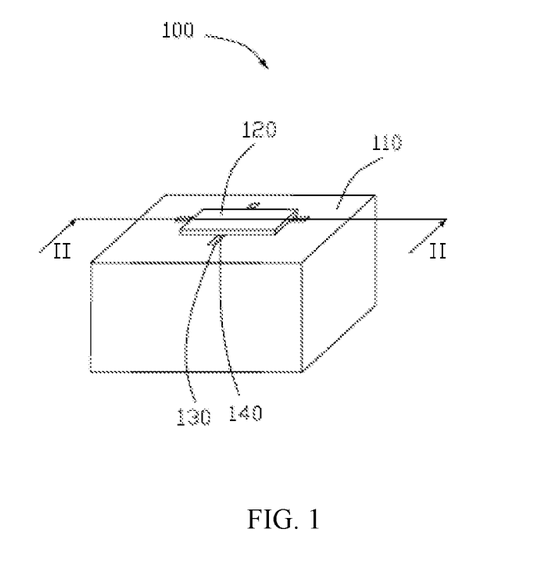
FIG. 1 is a three-dimensional schematic diagram of a light source system provided by a first form of the present disclosure.
Figure 2:
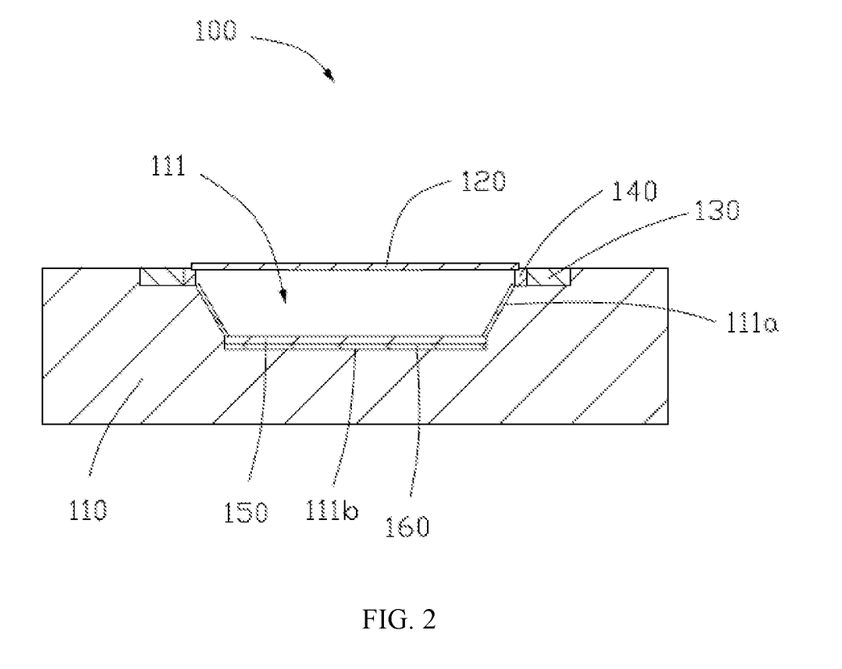
FIG. 2 is a cross-sectional view of a light source system shown in FIG. 1 taken along a line II-II.
Figure 3:
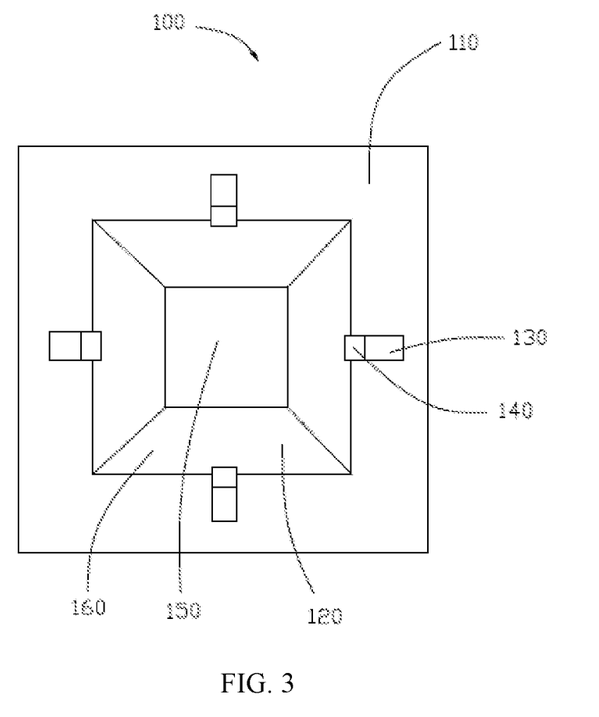
FIG. 3 is a top view of a light source system shown in FIG. 2.

Referring to FIG. 1 to FIG. 3, FIG. 1 is a three-dimensional schematic diagram of a light source system 100 provided by a first form of the present disclosure, FIG. 2 is a cross-sectional view of the light source system 100 shown in FIG. 1 taken along a line II-II, and FIG. 3 is a top view of the light source system 100 shown in FIG. 2. The light source system 100 provided by the teachings of the present disclosure includes a substrate 110, a light guiding element 120, at least one laser 130, a beam deflecting device 140, a wavelength conversion layer 150, and a reflective layer 160.

The light source system 100 in this form includes the at least one laser 130 configured to emit excitation light. The substrate 110 is made of material with a high thermal conductivity, and the material with a high thermal conductivity can be aluminum nitride, silicon nitride, silicon carbide, boron nitride, and/or a metal such as copper or aluminum, combinations thereof, among others. The substrate 110 is provided with a notch 111, and the laser 130 is received in a sidewall of the notch 111, thereby solving a heat dissipation problem of the laser 130. In addition, the laser 130 and the wavelength conversion layer 150 are located in a same notch 111, and the light source system 100 and a lighting device to which the light source system 100 is applied have a small volume and a simple and compact structure.

The beam deflecting device 140 and the at least one laser 130 are provided in one-to-one correspondence, and the beam deflecting device 140 is configured to guide the excitation light emitted by the at least one laser 130 corresponding to the beam deflecting device 140 to be irradiated to the wavelength conversion layer 150. The beam deflecting device 140 can be a prism, an aspheric lens, a free arc-shaped surface, a reflective mirror, and so on.

The reflective layer 160 can be a diffuse reflective layer or a metal reflective layer, covers a wall of the notch 111 and is configured to reflect light, to improve a light emission efficiency of the light source system 100.

The wavelength conversion layer 150 is provided on a part of the reflective layer 160 and is configured to perform wavelength conversion on the excitation light to obtain excited light. The wavelength conversion layer 150 transfers heat to the substrate 110 via the reflective layer 160 and dissipates the heat through the substrate 110, thereby solving the heat dissipation problem of the wavelength conversion layer 150.

The light guiding element 120 covers an opening of the notch 111 and is configured to reflect the excitation light and transmit the excited light, and the excited light is emitted from the light guiding element 120 to obtain light to be emitted by the light source system 100.

The substrate 110 of the light source system 100 is made of material with a high thermal conductivity, and the at least one laser 130 is received in the wall of the substrate 110. The heat generated by the wavelength conversion layer 150 is transferred to the substrate 110 via the reflective layer 160, thereby solving the heat dissipation problems of the at least one laser 130 and the wavelength conversion layer 150 of the light source system.

In addition, the light source system 100 adopts the at least one laser 130, and the at least one laser 130 and the wavelength conversion layer 150 are received in the notch 111 of the same substrate 110, so that the light source system 100 not only has high light emission brightness, but also has a small volume. The light source system 100 can also be applied to a lighting equipment, and the lighting device provided by the teachings of the present disclosure can be applied in the fields of automobile lamp devices, stage lights, and laser headlights.

In the first form, the light source system 100 includes four identical lasers 130. In some variations, the at least one laser 130 is a blue laser configured to emit blue excitation light. It should be understood that the at least one laser 130 is not limited to a blue laser, and the at least one laser 130 can include an ultraviolet laser, a red laser, a green laser, or the like. It should also be understood that the light source system 100 can include one or two blue lasers or a blue laser array, and the specific number of the lasers 130 of the light source system 100 can be selected according to actual needs.

The notch 111 has a shape of a frustum, and the wall of the notch 111 includes four sidewalls 111a and one bottom wall 111b. The at least one laser 130 is exposed at a surface of the substrate 110, and any two lasers 130 are received in different sidewalls 111a of the notch 111. Each beam deflecting device 140 is disposed between the at least one laser 130 corresponding to the beam deflecting device 140 and the light guiding element 120.

It should be understood that, in some variations of the present disclosure, the light source system 100 includes less than four lasers 130, for example, three lasers 130. Each of any three sidewalls 111a of the notch 111 can be provided with a laser 130. Alternatively, two of the three lasers 130 are disposed on one sidewall 111a and the remaining one laser 130 is disposed on another sidewall 111a. Alternatively, the three lasers 130 are all disposed on any one sidewall 111a if heat dissipation conditions allow. Due to a reflective effect of the reflective layer 160 and filtering characteristics of the light guiding element 120, the excitation light can excite the wavelength conversion layer 150 to generate the excited light, and the excited light is emitted from the light source system 100 to obtain the light.

In some variations of the present disclosure, the wavelength conversion layer 150 is provided with yellow phosphors and configured to generate yellow excited light. The yellow excited light is emitted from the light guiding element 120 to obtain yellow light.

The wavelength conversion layer 150 is provided on the reflective layer 160 at the bottom wall 111b. The yellow excited light emitted by the wavelength conversion layer 150 and unconverted blue excitation light are directly incident onto the light guiding element 120. Under the reflection of the light guiding element 120 and the reflective layer 160, the unconverted part of the excitation light can excite the wavelength conversion layer 150 multiple times until it is converted into excited light and emitted through the light guiding element 120. It should be understood that the wavelength conversion layer 150 can be disposed on the reflective layer 160 at any position of the sidewall 111a, or any positions provided on multiple walls or a partial region of any wall of the notch 111. In addition, the wavelength conversion layer 150 can be configured to generate excited light of other colors under the excitation of the excitation light, such as red and green excited light. That is, in some variations the wavelength conversion layer 150 is provided with a red fluorescent material and a green fluorescent material in sections, so that optical power of the generated red excited light and that of the green excited light can reach a preset ratio. It should be understood that, in other forms, the wavelength conversion layer 150 can also be provided with yellow and green fluorescent materials, or yellow and red fluorescent materials, or yellow, red, and green fluorescent materials, and it is not limited to this.

In addition, in some variations the wavelength conversion layer 150 has a rough surface, to improve the light emission efficiency of the wavelength conversion layer 150 and reduce reflection loss when the excitation light glides at a large angle.

In some variations, the reflective layer 160 is disposed on the wall, that is, the reflective layer 160 covers four sidewalls 111a and one bottom wall 111b, so as to reflect the light therein from various directions in the light source system 100, thereby increasing the number of the light reflection and improving a conversion efficiency of the excitation light. In addition, the light in the notch 111 can only be emitted from the light guiding element 120, which enhances the light emission efficiency of the light source system 100.

In this form, the light guiding element 120 is configured to reflect the excitation light and transmit the excited light, and the light guiding element 120 can be a beam-splitting filter plated with a blue-reflective and yellow-transmissive film. It should be understood that in some variations, the light guiding element 120 is a prism provided with an optical film, and the prism facilitates multiple reflections of the excitation light in the light source system 100. In other variations, the light guiding element 120 can be coated according to the colors of the excitation light and the excited light.

It should be understood that, in some variations, the notch 111 can have a shape with which its opening and the bottom wall 111b have different areas. For example, in at least one variation an area of the bottom wall 111b is smaller than the area of the opening, such as a circular frustum shape, a circular cone shape, a pyramid shape, or other irregular shapes such as a shape having a U-shaped or V-shaped cross-section, in order to enhance the unconverted part of the excitation light emitted from the wavelength conversion layer 150 to be reflected back to the wavelength conversion layer 150 and converted into excited light. That is, the unconverted part of the excitation light emitted from the wavelength conversion layer 150 and incident on the light guiding element 120 is reflected back to the reflective layer 160, reflected by the reflective layer 160 to the wavelength conversion layer 150 and converted into excited light and emitted from the light guiding element 120. It should be understood that the laser 130 can be disposed on any sidewall of the notch 111. In some variations, the wavelength conversion layer 150 is disposed on the bottom wall of a U-shaped notch, or the wavelength conversion layer 150 is disposed on one sidewall of a V-shaped notch, and the wavelength conversion layer 150 and the laser 130 can be located on a same sidewall or opposite sidewalls.

Figure 4:
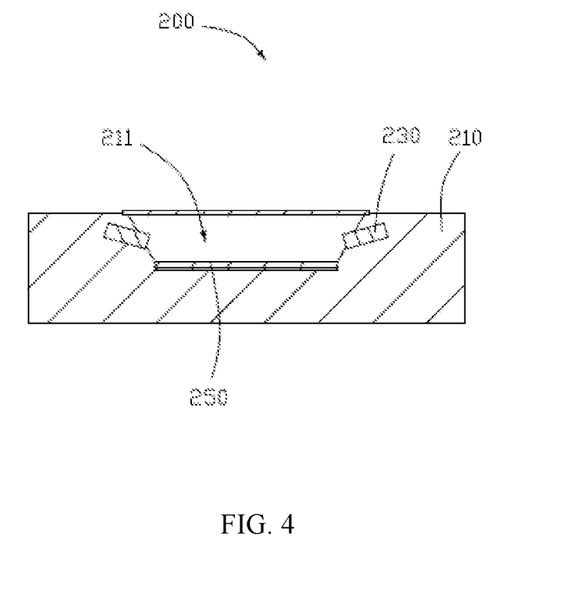
FIG. 4 is a cross-sectional view of a light source system provided by a second form of the present disclosure.
Figure 5:
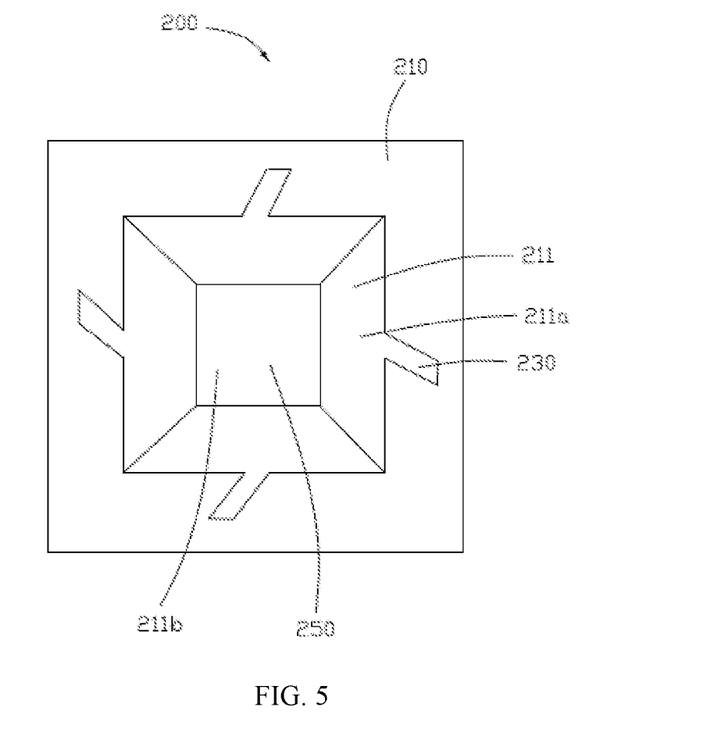
FIG. 5 is a top view of the light source system shown in FIG. 4.
Figure 6:
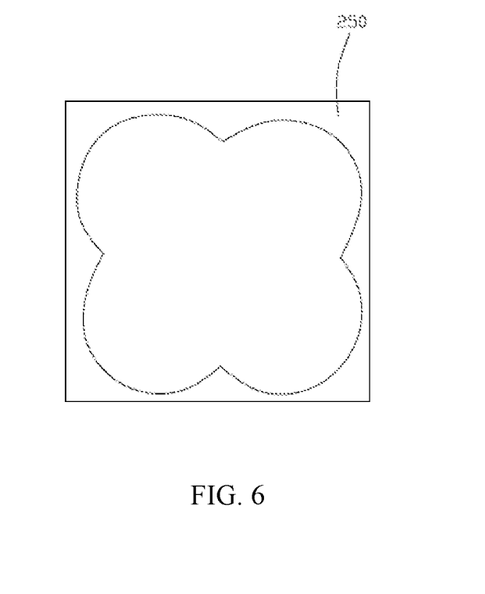
FIG. 6 is a schematic diagram of spots on a wavelength conversion layer shown in FIG. 4.

Referring to FIG. 4 to FIG. 6, FIG. 4 is a cross-sectional view of a light source system 200 provided by a second form of the present disclosure, FIG. 5 is a top view of the light source system 200 shown in FIG. 4, and FIG. 6 is a schematic diagram of spots on a wavelength conversion layer 250 shown in FIG. 4.

The cross-sectional view of the light source system 200 provided in the form as shown in FIG. 4 is obtained in the same manner as the light source system 100.

A difference between the light source system 200 and the light source system 100 mainly lies in that the at least one laser 230 in the light source system 200 is received in the sidewall 211a of the notch 211 of the substrate 210 at a preset angle. In such a manner, the excitation light emitted by the at least one laser 230 propagates along a straight line to and irradiated by the wavelength conversion layer 250, and the beam deflecting device is omitted. It should be noted that, within the scope of the spirit or basic features of the present disclosure, various specific solutions applicable to the first form can also be correspondingly applied to the second form and will not be repeated herein to save space and avoid duplication.

Specifically, as shown in FIG. 4 and FIG. 5, the at least one laser 230 is at a certain angle with respect to the bottom wall 211b in a perpendicular direction, in such a manner that the excitation light emitted by the at least one laser 230 propagates along a straight line to and irradiated by the wavelength conversion layer 250, thereby omitting the beam deflecting device; as shown in FIG. 5, the at least one laser 230 is at a certain angle with respect to the sidewall 211a in a horizontal direction, in such a manner that spots formed on the wavelength conversion layer 250 by any two lasers 230 partially overlap and partially do not overlap, and then spots emitted by the lasers 230 can be more uniformly irradiated on the wavelength conversion layer 250, which can avoid a problem that a conversion efficiency of the wavelength conversion layer 250 is reduced due to excessive local heat of the wavelength conversion layer 250. The laser spots irradiated on the wavelength conversion layer 250 are as shown in FIG. 6.

The light source system 200 provided in the second form can solve the heat dissipation problems of the at least one laser 230 and the wavelength conversion layer 250, and the light source system 200 and a lighting device to which the light source system 200 is applied have a small volume and a simple and compact structure. In addition, the number of optical devices used in the light source system 200 is reduced, an internal space of the light source system 200 is saved, and the cost is lower.

Figure 7:
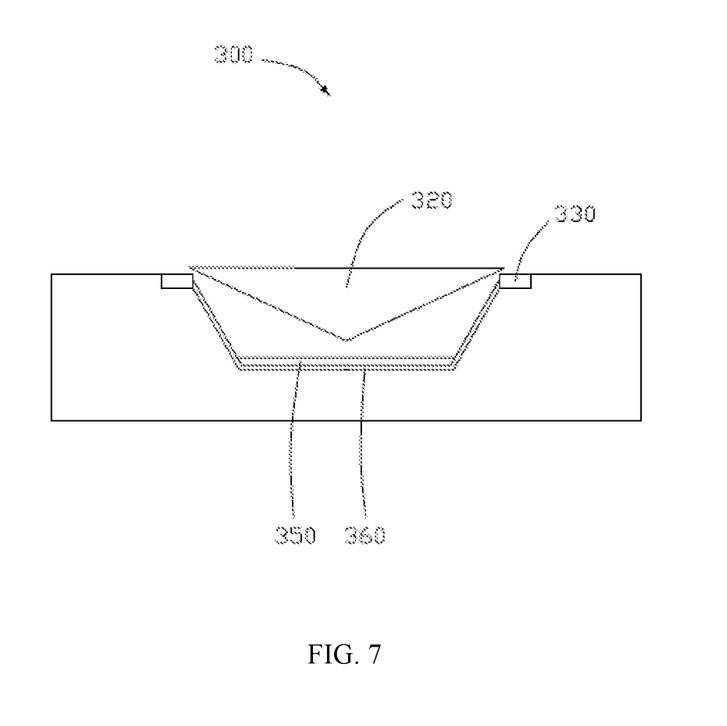
FIG. 7 is a cross-sectional view of a light source system provided by a third form of the present disclosure.

Referring to FIG. 7, which is a cross-sectional view of a light source system 300 provided by a third form of the present disclosure as shown in FIG. 1.

The cross-sectional view of the light source system 300 provided in the form as shown in FIG. 7 is obtained in the same manner as the light source system 100.

A difference between the light source system 300 and the light source system 100 mainly lies in that the at least one laser 330 of the light source system 300 emits excitation light in a first polarization state and the wavelength conversion layer 350 changes a polarization state of the excitation light. Also, the light guiding element 320 is a polarizing prism plated with an optical film and the polarizing prism is configured to reflect light of the first polarization state and transmit light of another polarization state. That is, the polarization state of the excitation light of the first polarization state is changed by the wavelength conversion layer 350, and the excitation light of the first polarization state is finally emitted from the light guiding element 320 in forms of other polarization states. Also, excited light of other polarization states is also emitted from the light guiding element 320, and blue excitation light and yellow excited light that are emitted from the light guiding element 320 are combined to obtain white light. It should be noted that, within the scope of the spirit or basic features of the present disclosure, various specific solutions applicable to the first form can also be correspondingly applied to the third form and will not be repeated herein in order to save space and avoid duplication.

The light source system 300 provided in the third form can solve the heat dissipation problems of the laser 330 and the wavelength conversion layer 350 of the light source system 300, and the light source system 300 and a lighting device to which the light source system 300 is applied have a small volume and a simple and compact structure.

The above are only the forms or variations of the present disclosure and do not limit the patent scope of the present disclosure. Any equivalent structure or equivalent process transformation made by using the description and drawings of the present disclosure, or those directly or indirectly used in other related technical fields are similarly included in the patent protection scope of the present disclosure.

What is claimed is:
1. A light source system, comprising:
   at least one laser configured to emit excitation light;
   a substrate made of material with a high thermal conductivity, wherein the substrate is provided with a notch, and the at least one laser is received in a sidewall of the notch;
   a reflective layer covering a wall of the notch and configured to reflect the excitation light;

a wavelength conversion layer provided on a part of the reflective layer and configured to perform wavelength conversion on the excitation light to obtain excited light; and a light guiding element covering an opening of the notch and configured to guide the excitation light and the excited light, to obtain light to be emitted by the light source system.

2. The light source system according to claim 1, wherein the light guiding element comprises a beam-splitting filter.

3. The light source system according to claim 1, wherein the wall comprises a bottom wall and the sidewall, and the bottom wall has an area different from the opening.

4. The light source system according to claim 3, wherein the reflective layer covers both the bottom wall and the sidewall of the notch, and the wavelength conversion layer is disposed on a part of the reflective layer covering the bottom wall.

5. The light source system according to claim 1, further comprising:

at least one beam deflecting device in one-to-one correspondence with the at least one laser, wherein each of the at least one beam deflecting device is configured to guide excitation light emitted by corresponding one of the at least one laser to irradiate the wavelength conversion layer.

6. The light source system according to claim 5, wherein the notch has a shape of a frustum, the at least one laser is exposed out of a surface of the substrate, any two lasers of the at least one laser are received in different sidewalls of the notch, and each of the at least one beam deflecting device is disposed between the corresponding one of the at least one laser and the light guiding element.

7. The light source system according to claim 4, wherein the at least one laser comprises a plurality of lasers, and each of the plurality of lasers is received in the sidewall of the notch at a preset angle, in such a manner that excitation light emitted by the laser propagates in a straight line to irradiate the wavelength conversion layer.

8. The light source system according to claim 6, wherein spots formed on the wavelength conversion layer by any two of the at least one laser partially overlap.

9. The light source system according to claim 1, wherein the light guiding element is a prism.

10. The light source system according to claim 9, wherein the at least one laser emits excitation light in a first polarization state, the wavelength conversion layer is configured to change the polarization state of the excitation light, and the prism is configured to reflect light of the first polarization state and transmit light of another polarization state.

11. A lighting device, comprising:

a light source system, wherein the light source system comprises:

at least one laser configured to emit excitation light;

a substrate made of material with a high thermal conductivity, wherein the substrate is provided with a notch, and the at least one laser is received in a sidewall of the notch;

a reflective layer covering a wall of the notch and configured to reflect the excitation light;

a wavelength conversion layer provided on a part of the reflective layer and configured to perform wavelength conversion on the excitation light to obtain excited light; and a light guiding element covering an opening of the notch and configured to guide the excitation light and the excited light, to obtain light to be emitted by the light source system.

12. The lighting device according to claim 11, wherein the light guiding element comprises a beam-splitting filter.

13. The lighting device according to claim 11, wherein the wall comprises a bottom wall and the sidewall, and the bottom wall has an area different from the opening.

14. The lighting device according to claim 13, wherein the reflective layer covers both the bottom wall and the sidewall of the notch, and the wavelength conversion layer is disposed on a part of the reflective layer covering the bottom wall.

15. The lighting device according to claim 11, further comprising:

at least one beam deflecting device in one-to-one correspondence with the at least one laser, wherein each of the at least one beam deflecting device is configured to guide excitation light emitted by corresponding one of the at least one laser to irradiate the wavelength conversion layer.

16. The lighting device according to claim 15, wherein the notch has a shape of a frustum, the at least one laser is exposed out of a surface of the substrate, any two lasers of the at least one laser are received in different sidewalls of the notch, and each of the at least one beam deflecting device is disposed between the corresponding one of the at least one laser and the light guiding element.

17. The lighting device according to claim 14, wherein the at least one laser comprises a plurality of lasers, and each of the plurality of lasers is received in the sidewall of the notch at a preset angle, in such a manner that excitation light emitted by the laser propagates in a straight line to irradiate the wavelength conversion layer.

18. The lighting device according to claim 16, wherein spots formed on the wavelength conversion layer by any two of the at least one laser partially overlap.

19. The lighting device according to claim 11, wherein the light guiding element is a prism.

20. The lighting device according to claim 19, wherein the at least one laser emits excitation light in a first polarization state, the wavelength conversion layer is configured to change the polarization state of the excitation light, and the prism is configured to reflect light of the first polarization state and transmit light of another polarization state.

21. A light source system, comprising:

at least one laser configured to emit excitation light;

a substrate made of material with a high thermal conductivity, wherein the substrate is provided with a notch, and the at least one laser is received in a sidewall of the notch;

a reflective layer covering a wall of the notch and configured to reflect the excitation light;

a wavelength conversion layer provided on a part of the reflective layer and configured to perform wavelength conversion on the excitation light to obtain excited light; and a light guiding element covering an opening of the notch and configured to guide the excitation light and the excited light, to obtain light to be emitted by the light source system, wherein the at least one laser emits excitation light in a first polarization state, the wavelength conversion layer is configured to change the polarization state of the excitation light, and the light guiding element is configured to reflect light of the first polarization state and transmit light of another polarization state.

* * * * *